United States Patent
Lee et al.

(10) Patent No.: US 10,796,735 B1
(45) Date of Patent: Oct. 6, 2020

(54) READ TRACKING SCHEME FOR A MEMORY DEVICE

(71) Applicant: QUALCOMM Incorporated, San Diego, CA (US)

(72) Inventors: Hochul Lee, Los Angeles, CA (US); Keejong Kim, Phoenix, AZ (US); Anil Chowdary Kota, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/459,320

(22) Filed: Jul. 1, 2019

(51) Int. Cl.
*G11C 7/22* (2006.01)
*G11C 7/08* (2006.01)
*G11C 7/12* (2006.01)
*G11C 7/14* (2006.01)
*G11C 7/00* (2006.01)
*G11C 7/06* (2006.01)

(52) U.S. Cl.
CPC .................. *G11C 7/08* (2013.01); *G11C 7/12* (2013.01); *G11C 7/227* (2013.01); *G11C 7/00* (2013.01); *G11C 7/06* (2013.01); *G11C 7/14* (2013.01)

(58) Field of Classification Search
CPC ......... G11C 17/16; G11C 17/18; G11C 17/00; G11C 11/00; G11C 17/02; G11C 11/412; G11C 11/417; G11C 7/04; G11C 11/419; G11C 17/08; G11C 7/12; G11C 7/227; G11C 8/12; H01L 27/1104
USPC ............................. 365/96, 158, 225.7, 94, 97
See application file for complete search history.

(56) References Cited

U.S. PATENT DOCUMENTS 6,181,626 B1 * 1/2001 Brown ..................... G11C 7/08
                                                         365/205
8,611,144 B2 * 12/2013 Terzioglu ............... G11C 17/16
                                                         365/158
2014/0010032 A1  1/2014 Seshadri et al.

OTHER PUBLICATIONS

Shih Y-C., et al., "Logic Process Compatible 40nm 16Mb, Embedded Perpendicular-MRAM with Hybrid-Resistance Reference, sub-μA Sensing Resolution, and 17.5nS Read Access Time", Symposium on VLSI Circuits Digest of Technical Papers, 2018, pp. 79-80.
Umeki Y., et al., "A 0.38-V Operating STT-MRAM with Process Variation Tolerant Sense Amplifier", IEEE Asian Solid-State Circuits Conference, 2013, pp. 249-252.

* cited by examiner

*Primary Examiner* — Thong Q Le
(74) *Attorney, Agent, or Firm* — Qualcomm Incorporated

(57) ABSTRACT

In certain aspects, a memory device includes memory bit cells coupled to a read bit line, and a first sense amplifier having a first input coupled to the read bit line, and a first output. The memory device also includes a latch amplifier having a first input coupled to the first output of the first sense amplifier, an enable input, and an output. The memory device also includes one or more dummy bit cells coupled to a dummy bit line, and a second sense amplifier having a first input coupled to the dummy bit line, and an output. The memory device further includes a trigger circuit having an input coupled to the output of the second sense amplifier, and an output coupled to the enable input of the latch amplifier.

15 Claims, 12 Drawing Sheets

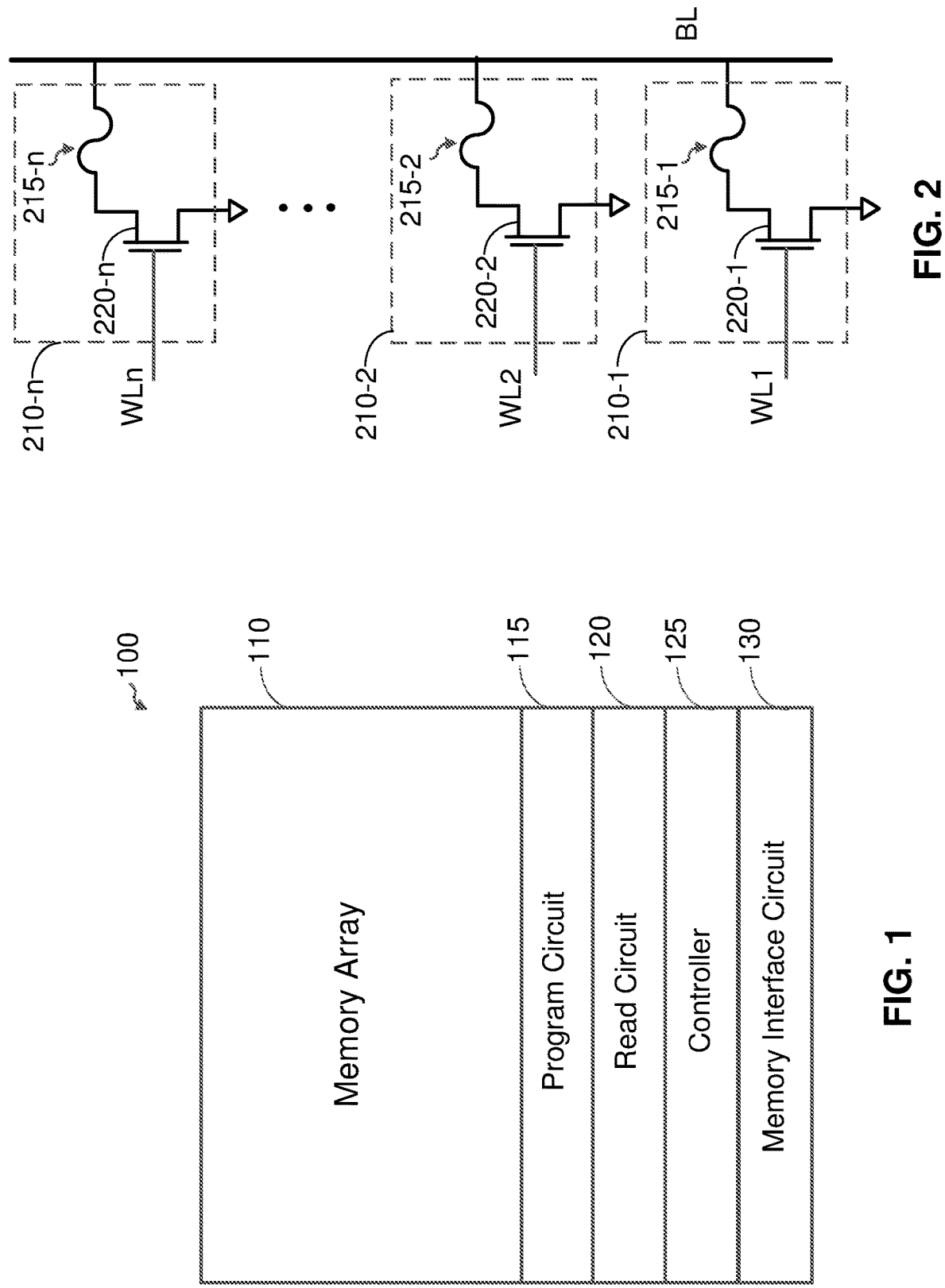

READ TRACKING SCHEME FOR A MEMORY DEVICE

BACKGROUND

Field

Aspects of the present disclosure relate generally to memory, and more particularly, to read tracking for a memory device.

Background

A memory device may be used (e.g., in a system on a chip (SoC)) to store data such as firmware, security keys, system settings, etc. Read tracking may be used to time read operations in a memory device to help ensure that bit cells in the memory device are accurately read.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a memory device. The memory device includes memory bit cells coupled to a read bit line, and a first sense amplifier having a first input coupled to the read bit line, and a first output. The memory device also includes a latch amplifier having a first input coupled to the first output of the first sense amplifier, an enable input, and an output. The memory device also includes one or more dummy bit cells coupled to a dummy bit line, and a second sense amplifier having a first input coupled to the dummy bit line, and an output. The memory device further includes a trigger circuit having an input coupled to the output of the second sense amplifier, and an output coupled to the enable input of the latch amplifier.

A second aspect relates to a system. The system includes a processor, and a memory device coupled to the processor. The memory device includes memory bit cells coupled to a read bit line, and a first sense amplifier having an input coupled to the read bit line, and an output. The memory device also includes a latch amplifier having an input coupled to the output of the first sense amplifier, an enable input, and an output. The memory device also includes one or more dummy bit cells coupled to a dummy bit line, and a second sense amplifier having an input coupled to the dummy bit line, and an output. The memory device further includes a trigger circuit having an input coupled to the output of the second sense amplifier, and an output coupled to the enable input of the latch amplifier, and an interface circuit configured to interface the output of the latch amplifier to the processor.

A third aspect relates to method for reading a memory bit cell, wherein the memory bit cell is coupled to an input of a first sense amplifier via a read bit line, and an output of the first sense amplifier is coupled to an input of a latch amplifier. The method includes charging a dummy bit line coupled to one or more dummy bit cells in response to the first sense amplifier being enabled, wherein the dummy bit line is coupled to an input of a second sense amplifier, and enabling the latch amplifier in response to a voltage at an output of the second sense amplifier reaching a threshold voltage.

A fourth aspect relates to an apparatus for reading a memory bit cell, wherein the memory bit cell is coupled to an input of a first sense amplifier via a read bit line, and an output of the first sense amplifier is coupled to an input of a latch amplifier. The apparatus includes means for charging a dummy bit line coupled to one or more dummy bit cells in response to the first sense amplifier being enabled, wherein the dummy bit line is coupled to an input of a second sense amplifier, and means for enabling the latch amplifier in response to a voltage at an output of the second sense amplifier reaching a threshold voltage.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 1 shows an example of a memory device according to certain aspects of the present disclosure.

FIG. 2 shows an example of multiple bit cells coupled to a bit line according to certain aspects of the present disclosure.

DETAILED DESCRIPTION

Figure 3:
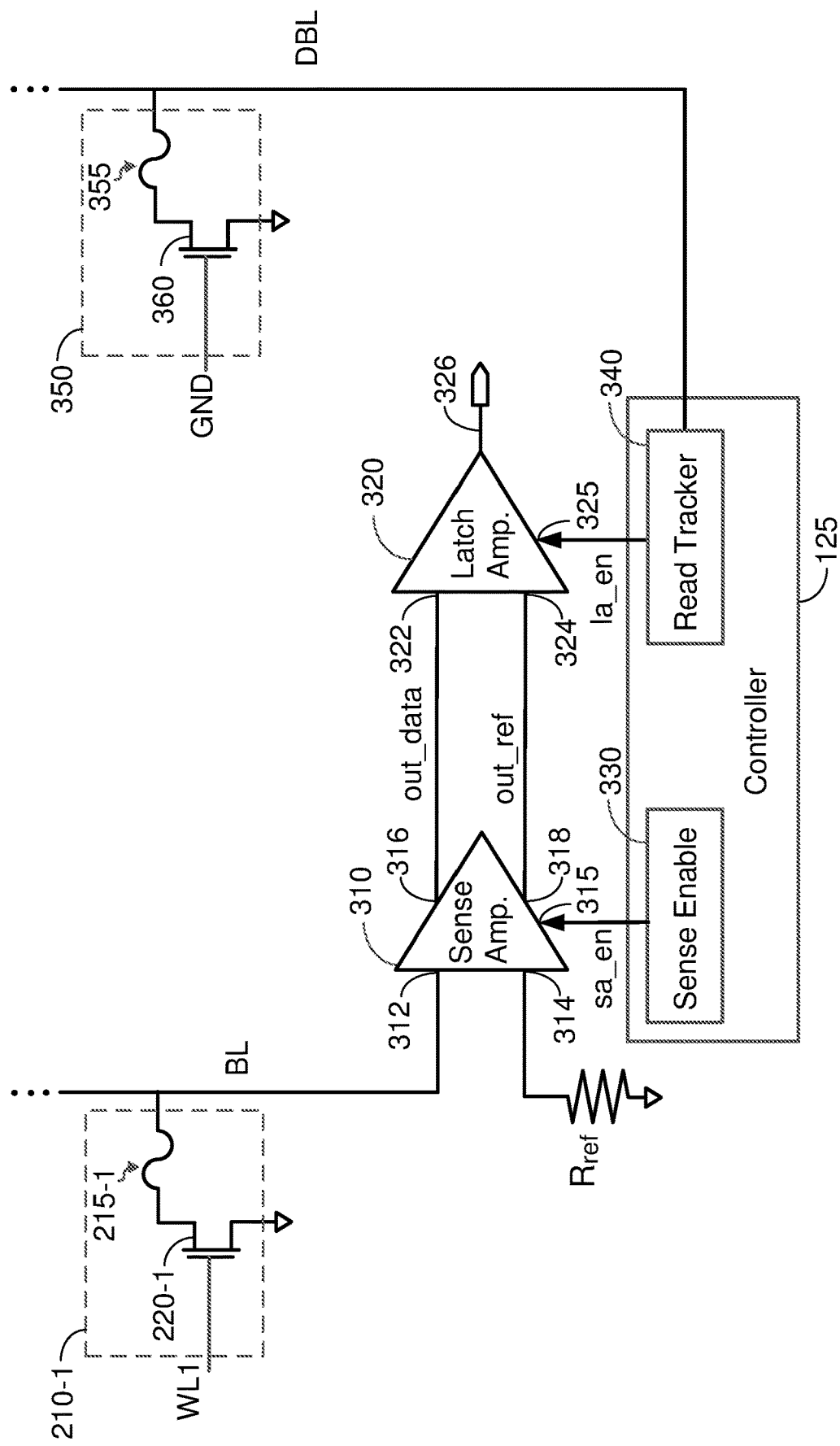
FIG. 3 shows an example of a read circuit including a sense amplifier and a latch amplifier according to certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

FIG. 1 shows a block diagram of an exemplary memory device 100 according to certain aspects of the present disclosure. The memory device 100 includes a memory array 110, a program circuit 115, a read circuit 120, a controller 125, and a memory interface circuit 130. The memory array 110 includes multiple bit cells arranged in rows and columns, where each bit cell stores a respective bit. The bit cells in each column may be coupled to a respective bit line, and the bit cells in each row may be coupled to a respective word line. The memory interface circuit 130 interfaces the memory device 100 to a processor or another device that accesses information stored in the memory array 110.

FIG. 2 shows an example of a column of bit cells 210-1 to 210-n in the array 110 coupled to a bit line (labeled "BL"). In this example, each of the bit cells 210-1 to 210-n is also coupled to a respective word line (labeled "WL1" to "WLn"). The word lines WL1 to WLn are used to select the bit cells 210-1 to 210-n in the column, as discussed further below. In the example shown in FIG. 2, the memory device 100 is implemented with programmable read-only memory (PROM). However, it is to be appreciated that the present disclosure is not limited to this example, and that the memory device 100 may be implemented with other types of memory, as discussed further below.

In this example, each of the bit cells 210-1 to 210-n includes a respective transistor 220-1 to 220-n and a respective fuse 215-1 to 215-n (e.g., fusible link). In each bit cell 210-1 to 210-n, the respective fuse 215-1 to 215-n is coupled between the bit line BL and the drain of the respective transistor 220-1 to 220-n. Also, in each bit cell 210-1 to 210-n, the gate of the respective transistor 220-1 to 220-n is coupled to the respective word line WL1 to WLn, and the source of the respective transistor 220-1 to 220-n is coupled to ground. In the example in FIG. 2, the transistors 220-1 to 220-n are implemented with n-type field effect transistors (NFETs), although it is to be appreciated that the transistors 220-1 to 220-n may also be implemented with other types of transistors.

The bit value stored in each bit cell 210-1 to 210-n depends on whether the respective fuse 215-1 to 215-n is blown or unblown. For example, a bit cell may store a bit value of zero if the respective fuse 215-1 to 215-n is unblown and store a bit value of one if the respective fuse 215-1 to 215-n is blown. Initially, the fuses 215-1 to 215-n in all of the bit cells 210-1 to 210-n are unblown, in which case the memory array 110 initially stores all zeros.

The memory array 110 may be programmed after manufacturing using the program circuit 115. In one example, the program circuit 115 may program data (which includes ones and zeros) into the bit cells 210-1 to 210-n by blowing the fuses of the bit cells corresponding to the ones in the data and leaving the fuses of the bit cells corresponding to the zeros in the data unblown.

To blow the fuse of one of the bit cells 210-1 to 210-n, the program circuit 115 sends a high current (e.g., 16 mA to 20 mA) through the fuse of the bit cell for a short time duration (e.g., 5 µs) to blow the fuse. The high current electro-migrates metal in the fuse, causing the resistance of the fuse to significantly increase. In this example, the resistance of an unblown fuse is low (e.g., 50Ω) and the resistance of a blown fuse is high (e.g., on the order of kΩ).

Blowing a fuse may be an irreversible process. Thus, once the fuse of a bit cell is blown, the fuse cannot be unblown. As a result, the bit cells 215-1 to 215-n can only be programmed once in this example, in which case the memory device 100 is one-time programmable.

The read circuit 120 may read the bit value stored in each of the bit cells 210-1 to 210-n by detecting whether the fuse of each of the bit cells 210-1 to 210-n is blown or unblown. To read the bit value stored in one of the bit cells 210-1 to 210-n, the read circuit 120 selects the bit cell by setting the respective word line high and the other word lines low. The read circuit 120 then pre-charges the bit line BL with a pre-charging current. If the fuse of the selected bit cell is blown, then the high-resistance of the blown fuse prevents most of the pre-charging current from flowing through the respective transistor. This allows the pre-charging current to charge the capacitive load on the bit line BL, causing the voltage (also referred to as potential) of the bit line BL to rise. In this example, the read circuit 120 may detect that the fuse is blown by detecting a large voltage on the bit line BL (e.g., a voltage above a reference voltage). In this case, the read circuit 120 may read a bit value of one.

If the fuse of the selected bit cell is unblown, then the low-resistance of the unblown fuse and the respective transistor (which is turned on) provide a low-resistance current path to ground. The low-resistance path to ground causes the voltage of the bit line BL to remain low. In this example, the read circuit 120 may detect that the fuse is unblown by detecting a low voltage on the bit line BL (e.g., a voltage below the reference voltage). In this case, the read circuit 120 may read a bit value of zero.

The memory interface 130 may send the bits read by the read circuit 120 to a processor (shown in FIG. 12) or another device that accesses information stored on the memory device 100.

It is to be appreciated that the exemplary program and read operations discussed above can also be used for the convention in which an unblown fuse corresponds to a bit value of one and a blown fuse corresponds to a bit value of zero. In this case, the memory array 110 initially stores all ones, and a bit cell is programmed with a zero by blowing the respective fuse. In addition, the read circuit 120 reads a one for a bit cell if the respective fuse is unblown, and reads a zero for a bit cell if the respective fuse is blown.

The controller 125 is configured to control operations of the memory device 100. For example, the controller 125 may receive a read command from a processor via the memory interface circuit 130. In response to the read command, the controller 125 may direct the read circuit 120 to read data from bit cells in the memory array 110 corresponding to an address or range of addresses accompanying the read command, and send the read data to the processor via the memory interface circuit 130.

FIG. 3 shows an example of a portion of the read circuit 120 for reading the bit values stored in the bit cells 210-1 to 210-n according to certain aspects. In this example, the read circuit 120 includes a sense amplifier 310, a reference resistor $R_{ref}$, and a latch amplifier 320.

The sense amplifier 310 has a first input 312, a second input 314, a first output 316, and a second output 318. The first input 312 of the sense amplifier 310 is coupled to the bit line BL, and the reference resistor $R_{ref}$ is coupled between the second input 314 of the sense amplifier 310 and ground.

The first output 316 of the sense amplifier 310 outputs a data voltage (labeled "out_data") and the second output 318 of the sense amplifier 310 outputs a reference voltage (labeled "out_ref"), as discussed further below.

The latch amplifier 320 has a first input 322 coupled to the first output 316 of the sense amplifier 310, a second input 324 coupled to the second output 318 of the sense amplifier 310, and an output 326. The latch amplifier 320 is configured to latch a logic state based on the data voltage out_data and the reference voltage out_ref from the sense amplifier 310, and output a logic value (a one or a zero) based on the latched logic state, as discussed further below.

In the example in FIG. 3, the controller 125 includes a sense enable circuit 330 configured to selectively enable the sense amplifier 310 by outputting a sense enable signal (labeled "sa_en") to an enable input 315 of the sense amplifier 310. The sense enable circuit 330 may enable the sense amplifier 310 each time the bit value of one of the bit cells 210-1 to 210-n is to be read. The controller 125 also includes a read tracker 340 configured to selectively enable the latch amplifier 320 by outputting a latch enable signal (labeled "la_en") to an enable input 325 of the latch amplifier 320. As discussed further below, the timing of the sense enable signal sa_en and the latch enable signal la_en during a read operation is important to achieve a reliable read.

An exemplary read operation for bit cell 210-1 will now be discussed according to certain aspects. It is to be appreciated that the exemplary read operation may also be performed for each of the other bit cells 210-2 to 210-n (not shown in FIG. 3) to read the bit values of the other bit cells 210-2 to 210-n.

To read the bit value of bit cell 210-1, bit cell 210-1 is first selected by asserting the word line WL1 high and asserting the other word lines WL2 to WLn low. This turns on the transistor 220-1 of bit cell 210-1 and turns off the transistors 220-2 to 220-n of the other bit cells 210-2 to 210-n. The voltage of the bit line BL is initially low (e.g., the capacitive load on the bit line BL is initially discharged).

After bit cell 210-1 is selected, the sense enable circuit 330 enables the sense amplifier 310 by outputting the sense enable signal sa_en to the enable input 315 of the sense amplifier 310. When enabled, the sense amplifier 310 outputs the reference voltage out_ref based on the reference resistor $R_{ref}$ coupled to the second input 314 of the sense amplifier 310. The sense amplifier 310 also pre-charges the bit line BL by sending a pre-charging current to the bit line BL through the first input 312. If the fuse 215-1 of bit cell 210 is blown, then the high-resistance of the blown fuse 215-1 prevents most of the pre-charging current from flowing to ground through the transistor 220-1. This allows the pre-charging current to charge the capacitive load on the bit line BL, causing the voltage of the bit line BL to rise. In this case, the sense amplifier 310 raises the data voltage out_data as the voltage of the bit line BL rises during pre-charging. Eventually the data voltage out_data reaches a steady state voltage. At the steady state voltage, the data voltage out_data is greater than the reference voltage out_ref.

If the fuse 215-1 of bit cell 210-1 is unblown, then the low-resistance of the unblown fuse 215-1 and the transistor 220-1 (which is turned on) provide a low-resistance current path to ground. The low-resistance path to ground causes the voltage of the bit line BL to remain low. In this case, the sense amplifier 310 keeps the data voltage out_data low based on the low voltage of the bit line BL, and the data voltage out_data is below the reference voltage out_ref.

After a period of time from the time the sense amplifier 310 is enabled, the read tracker 340 enables the latch amplifier 320 by outputting the latch enable signal la_en to the latch enable input 325 of the latch amplifier 320. Once enabled, the latch amplifier 320 latches a logic state based on the data voltage out_data and the reference voltage out_ref from the sense amplifier 310, and outputs a logic value (a one or a zero) based on the latched logic state. For example, the latch amplifier 320 may latch a first logic state that outputs a one at the output 326 if the data voltage out_data is greater than the reference voltage out_ref, and latch a second logic state that outputs a zero at the output 326 if the data voltage out_data is less than the reference voltage out_ref. In this example, the latch amplifier 320 outputs a one if the fuse 215-1 of bit cell 210-1 is blown and outputs a zero if the fuse 215-1 of bit cell 210-1 is unblown.

The time difference between the sense enable signal sa_en and the latch enable signal la_en (referred to as the read tracking time below) is important to achieve a reliable read operation. This is because, after the sense amplifier 310 is enabled, the read tracker 340 needs to wait a sufficient amount of time for the bit line BL to pre-charge before enabling the latch amplifier 320 for an accurate read. For example, if the read tracker 340 enables the latch amplifier 320 too soon after the sense amplifier 310 is enabled and the fuse 215-1 of bit cell 210-1 is blown, then the read tracker 340 may not provide a sufficient amount of time for the data voltage out_data to rise above the reference voltage out_ref. In this case, the latch amplifier 320 incorrectly outputs a zero instead of a one, resulting in a read error.

In one example, the read tracking time depends on the amount of time to charge a dummy bit line (labeled "DBL"). In this example, the dummy bit line DBL is coupled to one or more dummy bit cells 350. Note that FIG. 3 only shows one of the dummy bit cells 350 for ease of illustration. Each of the dummy bit cells 350 includes a respective fuse 355 and a respective transistor 360, in which the respective fuse 355 is coupled between the dummy bit line DBL and the drain of the respective transistor 360, and the gate and the source of the respective transistor 360 are coupled to ground. In one example, the fuses 355 of the dummy bit cells 350 are unblown. This may be done, for example, so that the capacitive load on the dummy bit line DBL approximates a maximum capacitive load on the bit line BL. In one example, the number of dummy bit cells coupled to the dummy bit line DBL may be equal to the number of bit cells 210-1 to 210-n coupled to the bit line BL.

The bit line BL may be referred to as a read bit line to distinguish the bit line BL (which is used to read bits from the bit cells 210-1 to 210-n) from the dummy bit line DBL. Also, the bit cells 210-1 to 210-n may be referred to as memory bit cells to distinguish the bit cells 210-1 to 210-n (which store bits) from the dummy bit cells.

During a read operation for bit cell 210-1, the capacitive load on the dummy bit line DBL is initially discharged. When the sense enable circuit 330 enables the sense amplifier 310 with the sense enable signal sa_en, the read tracker 340 starts charging the dummy bit line DBL with a charging current. This causes the voltage of the dummy bit line DBL to rise. The read tracker 340 may output the latch enable signal la_en to the latch amplifier 320 when the voltage of the dummy bit line DBL reaches a threshold voltage. Thus, in this example, the read tracking time depends on the time it takes to charge the dummy bit line DBL to the threshold voltage. The read tracker 340 may perform the same or similar operations for each of the other bit cells 210-2 to 210-n.

Figure 4:
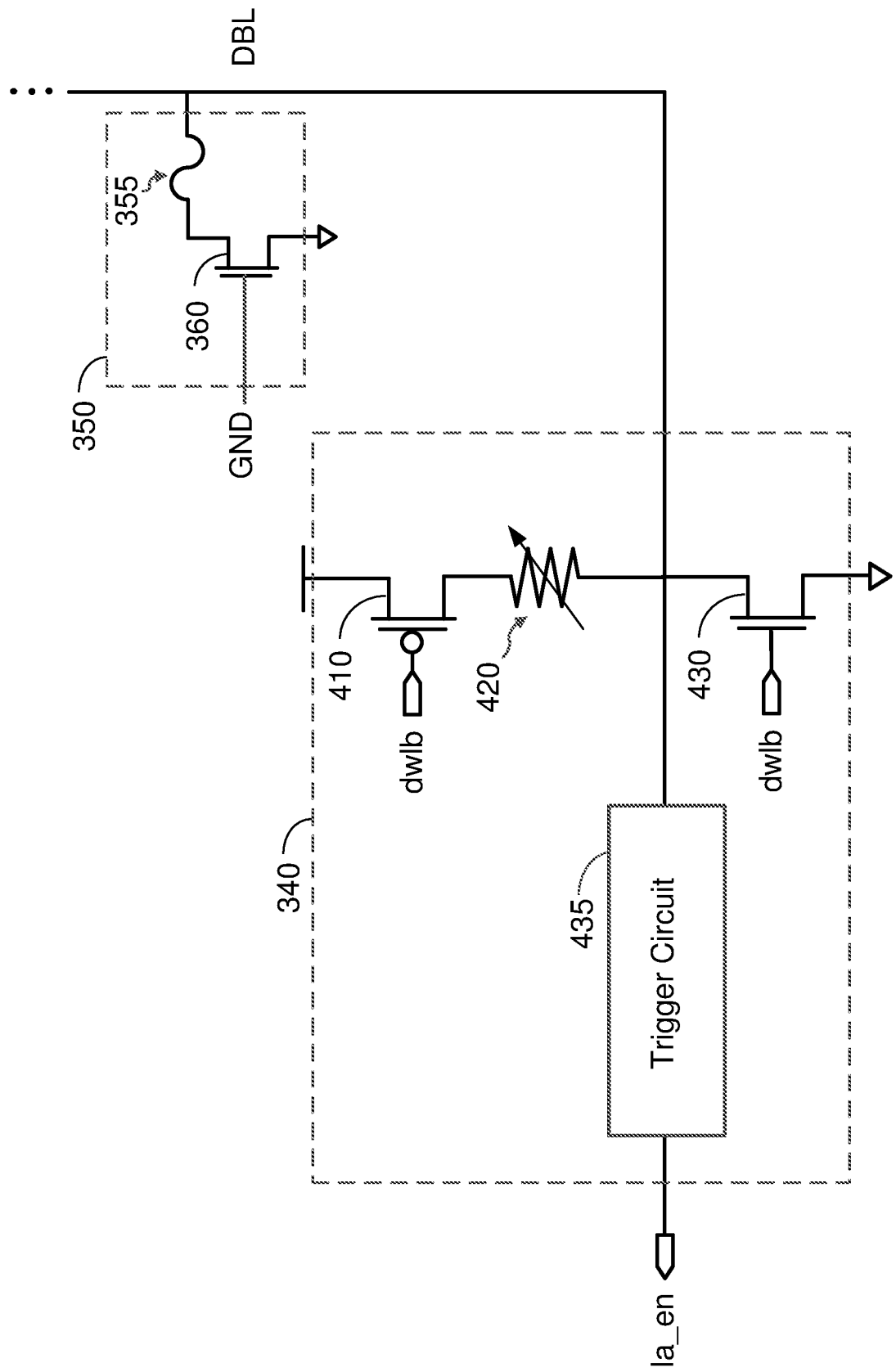
FIG. 4 shows an exemplary implementation of a read tracker according to certain aspects of the present disclosure.

FIG. 4 shows an exemplary implementation of the read tracker 340 according to certain aspects. In this example, the read tracker 340 includes a charge transistor 410 (e.g., PFET), a resistor 420, a discharge transistor 430 (e.g., NFET), and a trigger circuit 435. The source of the charge transistor 410 is coupled to a supply rail, and the resistor 420 is coupled between the drain of the charge transistor 410 and the dummy bit line DBL. The drain of the discharge transistor 430 is coupled to the dummy bit line DBL and the source of the discharge transistor 430 is coupled to ground. A control signal (labeled "dwlb") is applied to the gates of the charge transistor 410 and the discharge transistor 430 to control the on/off states of the charge transistor 410 and the discharge transistor 430, as discussed further below.

The trigger circuit 435 has an input coupled to the dummy bit line DBL and an output coupled to the enable input 325 of the latch amplifier 320. The trigger circuit 435 is configured to output the latch enable signal la_en in response to the voltage on the dummy bit line DBL reaching a threshold voltage, as discussed further below.

During a read operation for bit cell 210-1, the capacitive load on the dummy bit line DBL is initially discharged. This is accomplished by turning on the discharge transistor 430 and turning off the charge transistor 410 before the read operation (e.g., by setting dwlb high) so that the discharge transistor 430 discharges the capacitive load on the dummy bit line DBL to approximately ground. When the sense enable circuit 330 enables the sense amplifier 310, the charge transistor 410 is turned on and the discharge transistor 430 is turn off (e.g., by setting dwlb low). This allows charging current to flow from the supply rail to the dummy bit line DBL through the charge transistor 410 and the resistor 420 to charge the capacitive load on the dummy bit line DBL. When the voltage of the dummy bit line DBL reaches the threshold voltage of the trigger circuit 435, the trigger circuit 435 may output the latch enable signal la_en to the enable input 325 of the latch amplifier 320 immediately or after a time delay.

In this example, the read tracking time depends on the time it takes to charge the dummy bit line DBL to the threshold voltage of the trigger circuit 435, which depends on the resistance of the resistor 420. Thus, the read tracking time can be adjusted by adjusting the resistance of the resistor 420. In this regard, the resistor 420 may be implemented with a variable resistance resistor 420 (indicated by the arrow passing through the resistor 420 in FIG. 4). For the example in which the trigger circuit 435 has a time delay, the read tracking time also depends on the delay time of the trigger circuit 435. The read tracker 340 may perform the same or similar operations for each of the other bit cells 210-2 to 210-n.

To reliably read a bit cell (e.g., bit cell 210-1), it is desirable for the read tracker 340 to enable the latch amplifier 320 after the data voltage out_data reaches a voltage close to the steady state voltage (e.g., 95% of the steady state voltage) discussed above. This helps ensure that the magnitude of the difference between the data voltage out_data and the reference voltage out_ref (i.e., |out_data−out_ref|) is sufficiently large for a reliable read. In this regard, the resistance of the resistor 420 and/or another parameter of the read tracker 340 is set to provide a sufficient read tracking time for the data voltage out_data to reach a voltage close to the steady state voltage (e.g., 95% of the steady state voltage).

A challenge with setting the read tracking time is that the time it takes for the data voltage out_data to reach a voltage close to the steady state voltage varies with process-voltage-temperature (PVT) variations in the sense amplifier 310. For example, the data voltage out_data may reach a voltage close to the steady state voltage faster for a fast PVT corner than a slow PVT corner. To account for PVT variations, the read tracking time is made relatively long to ensure that sufficient time is provided for the data voltage out_data to reach a voltage close to the steady state voltage for the worst-case PVT scenario (e.g., slow PVT corner).

Figure 5:
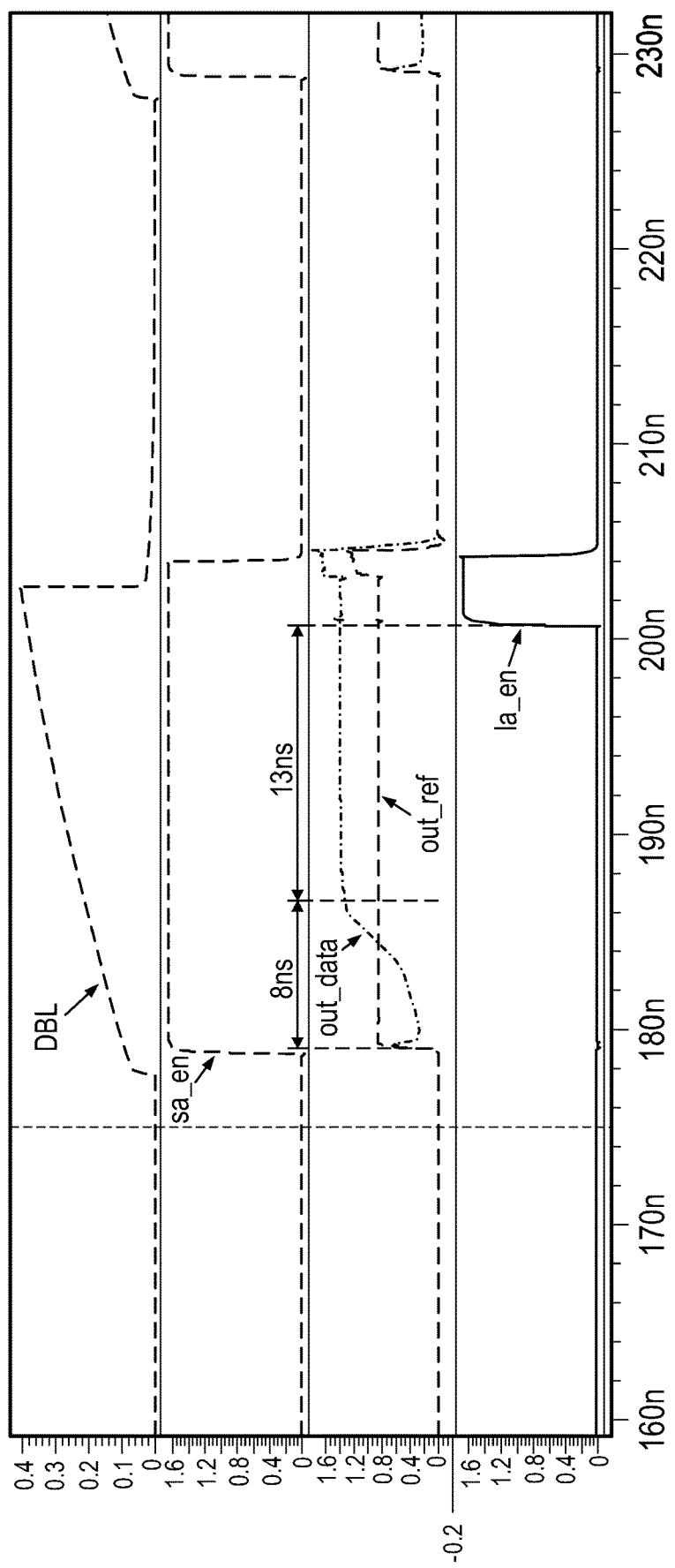
FIG. 5 is a timing diagram showing exemplary signals for a read circuit and a read tracker according to certain aspects of the present disclosure.

The above approach achieves reliable read operations across PVT variations. However, the above approach may result in a read tracking time that is much longer than needed to achieve a reliable read operation for a non-worst-case PVT scenario (e.g., a fast PVT corner), resulting in a longer read access time (which decreases performance) and higher power consumption. An example of this is illustrated in FIG. 5, which shows an exemplary timing diagram of the sense enable signal sa_en, the data voltage out_data, the reference voltage out_ref, the latch enable signal la_en, and the voltage of the dummy bit line DBL. In this example, the fuse of the bit cell being read is blown. Both the sense enable signal sa_en and the latch enable signal la_en have a logic value of one. In this example, the data voltage out_data reaches a voltage close to the steady state voltage approximately 8 ns after the sense enable signal sa_en. At this point, the latch amplifier 320 is capable of making a reliable read. However, the latch amplifier 320 is not enabled for another 13 ns due to the large read tracking time, which is set based on the worst-case PVT scenario. As a result, the read access time is increased and additional power is consumed.

To address this, aspects of the present disclosure provide a read tracker including a sense amplifier that tracks PVT variations in the sense amplifier 310. This allows the read tracker to automatically adjust (i.e., modulate) the read tracking time according to the PVT variations. As a result, the read tacker is able to reduce the read tracking time for non-worst-case PVT scenarios (e.g., a fast PVT corner), which reduces read access times and power while maintaining reliable read operations.

Figure 6:
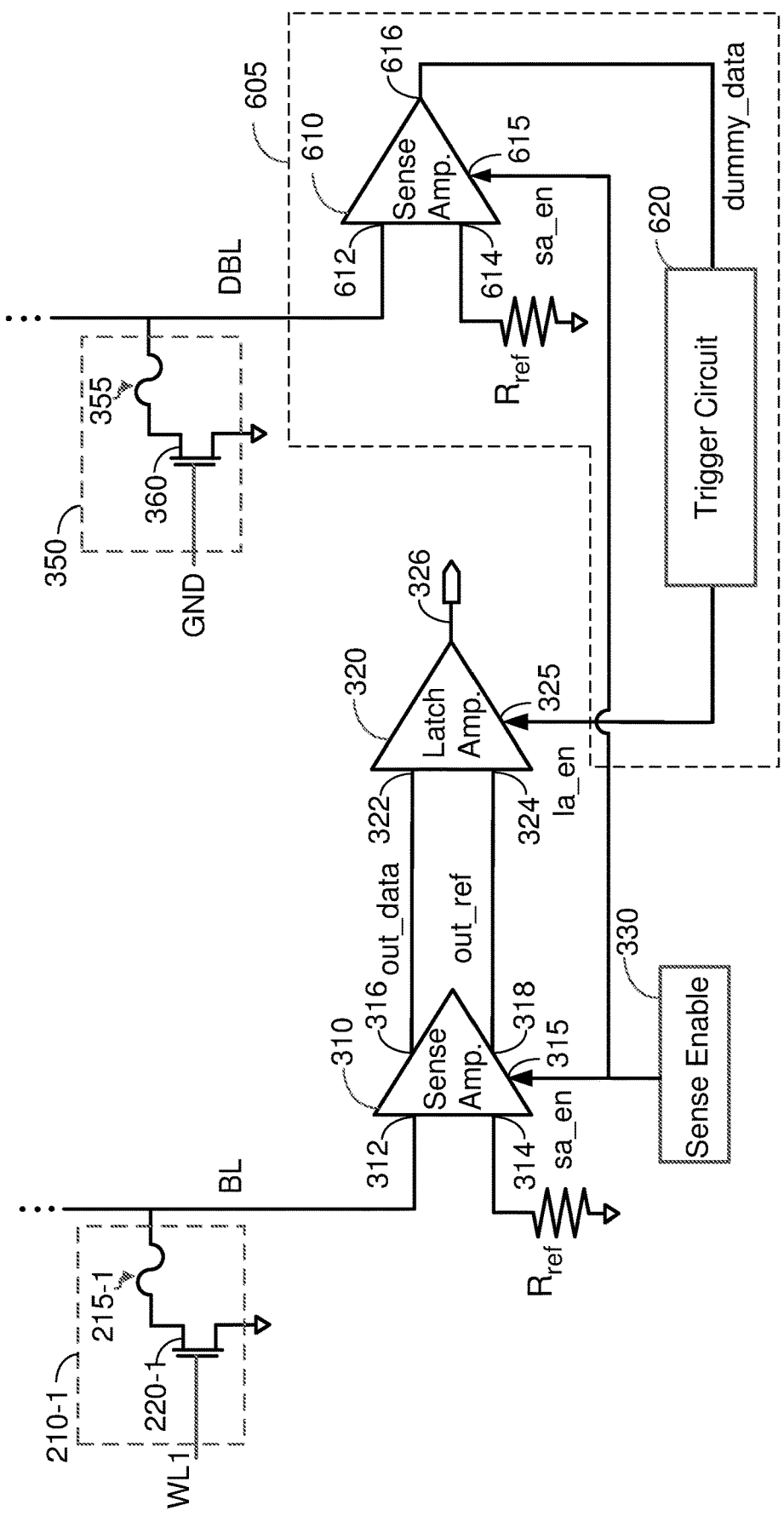
FIG. 6 shows an example of a read tracker including a sense amplifier according to certain aspects of the present disclosure.

FIG. 6 shows an example of a read tracker 605 according to aspects of the present disclosure. The read tracker 605 includes a sense amplifier 610, a reference resistor $R_{ref}$, and a trigger circuit 620. In the discussion below, the sense amplifier 310 in the read circuit 120 is referred to as the first sense amplifier and the sense amplifier 610 in the read tracker 605 is referred to as the second sense amplifier.

In certain aspects, PVT variations in the second sense amplifier 610 track PVT variations in the first sense amplifier 310. This may be accomplished, for example, by integrating the first and second sense amplifiers 310 and 610 on the same chip (i.e., die) in close proximity to each other so that the first and second sense amplifiers 310 and 610 are subject to the same or similar PVT conditions. Also, the second sense amplifier 610 may have the same structure or substantially the same structure as the first sense amplifier 310.

The second sense amplifier 610 has a first input 612, a second input 614, and an output 616. The first input 612 of the second sense amplifier 610 is coupled to the dummy bit line DBL, and the reference resistor $R_{ref}$ is coupled between the second input 614 of the second sense amplifier 610 and ground. The output 616 of the second sense amplifier 610 is coupled to the input of the trigger circuit 620, and outputs a dummy output voltage (labeled "dummy_data) to the trigger circuit 620. The second sense amplifier 610 has an enable input 615 configured to receive the sense enable signal sa_en from the sense enable circuit 330. Thus, the second sense amplifier 610 is enabled at approximately the same time as the first sense amplifier 310 during a read operation, as discussed further below.

The input of the trigger circuit 620 is coupled to the output 616 of the second sense amplifier 610 and the output of the trigger circuit 620 is coupled to the enable input 325 of the latch amplifier 320. The trigger circuit 620 is configured to output the latch enable signal la_en to the enable input 325 of the latch amplifier 320 in response to the dummy output voltage dummy_data reaching a threshold voltage. In certain aspects, when the voltage of the dummy bit line DBL reaches the threshold voltage of the trigger circuit 620, the trigger circuit 620 outputs the latch enable signal la_en immediately or after a time delay (e.g., programmable time delay).

An exemplary read operation for bit cell 210-1 will now be discussed according to certain aspects. It is to be appreciated that the exemplary read operation may also be performed for each of the other bit cells 210-2 to 210-n (not shown in FIG. 6) to read the bit values of the other bit cells 210-2 to 210-n.

Before the read operation, the first sense amplifier 310 discharges the bit line BL and the second sense amplifier 610 discharges the dummy bit line DBL. Thus, the voltage on the bit line BL and the voltage on the dummy bit line DBL are initially low. In one example, the first sense amplifier 310 may discharge the bit line BL when the logic value at the enable input 315 of the first sense amplifier 310 is zero, and the second sense amplifier 610 may discharge the dummy bit line DBL when the logic value at the enable input 615 of the second sense amplifier 610 is zero. In this example, the sense enable signal sa_en has a logic value of one (i.e., the first and second sense amplifiers 310 and 610 are enabled when the logic value at their enable inputs 315 and 615 is one).

To read the bit value of bit cell 210-1, the read circuit 120 selects bit cell 210-1 by asserting the word line WL1 high and asserting the other word lines WL2 to WLn low. This turns on the transistor 220-1 of bit cell 210-1 and turns off the transistors 220-2 to 220-n of the other bit cells 210-2 to 210-n.

After bit cell 210-1 is selected, the sense enable circuit 330 outputs the sense enable signal sa_en to the first and second amplifiers 310 and 610 to enable the first and second sense amplifiers 310 and 610. When enabled, the first sense amplifier 310 outputs the reference voltage out_ref based on the reference resistor $R_{ref}$ coupled to the second input 314 of the first sense amplifier 310. The first sense amplifier 310 also pre-charges the bit line BL by sending a pre-charging current to the bit line BL through the first input 312. If the fuse 215-1 of bit cell 210 is blown, then the pre-charging current charges the capacitive load on the bit line BL, causing the voltage of the bit line BL to rise. In this case, the first sense amplifier 310 raises the data voltage out_data as the voltage of the bit line BL rises during pre-charging. Eventually the data voltage out_data reaches a steady state voltage. At the steady state voltage, the data voltage out_data is greater than the reference voltage out_ref.

If the fuse 215-1 of bit cell 210-1 is unblown, then the low-resistance of the unblown fuse 215-1 and the transistor 220-1 (which is turned on) provide a low-resistance current path to ground. The low-resistance path to ground causes the voltage of the bit line BL to remain low. In this case, the first sense amplifier 310 keeps the data voltage out_data low based on the low voltage of the bit line BL, and the data voltage out_data is below the reference voltage out_ref.

The second sense amplifier 610 is enabled at approximately the same time as the first sense amplifier 310 by the sense enable signal sa_en. When enabled, the sense amplifier 610 charges the dummy bit line DBL by sending a charging current to the dummy bit line DBL through the first input 612. The charging current charges the capacitive load on the dummy bit line DBL, causing the voltage of the dummy bit line DBL to rise. The second sense amplifier 610 raises the dummy output voltage dummy_data at the output 616 as the voltage of the bit line DBL rises during charging of the dummy bit line DBL. When the dummy output voltage dummy_data reaches the threshold voltage of the trigger circuit 620, the trigger circuit 620 outputs the latch enable signal la_en (e.g., immediately or after a time delay).

Thus, in this example, the read tracking time depends on the time it takes for the dummy output voltage dummy_data output by the second sense amplifier 610 to reach the threshold voltage of the trigger circuit 620. The time it takes for the dummy output voltage dummy_data to reach the threshold voltage of the trigger circuit 620 varies with PVT variations in the second sense amplifier 610.

As discussed above, the PVT variations in the second sense amplifier 610 track the PVT variations in the first sense amplifier 310. As a result, when the time it takes for the data voltage out_data to reach a voltage close to the steady state voltage (e.g., 95% of the steady state voltage) changes due to PVT variations in the first sense amplifier 310, the time it takes for the dummy output voltage dummy_data to reach the threshold voltage of the trigger circuit 620 also changes in the same direction due to similar PVT variations in the second sense amplifier 610. For example, if the time it takes for the data voltage out_data to reach a voltage close to the steady state voltage decreases due to PVT variations in the first sense amplifier 310, then the time it takes for the dummy output voltage dummy_data to reach the threshold voltage of the trigger circuit 620 also decreases, reducing the read tracking time. Thus, the second sense amplifier 610 enables the read tracker 605 to automatically adjust (i.e., modulate) the read tracking time according to PVT variations, resulting in more efficient read tracking compared with the read tracker 340 in FIG. 4.

Figure 7:
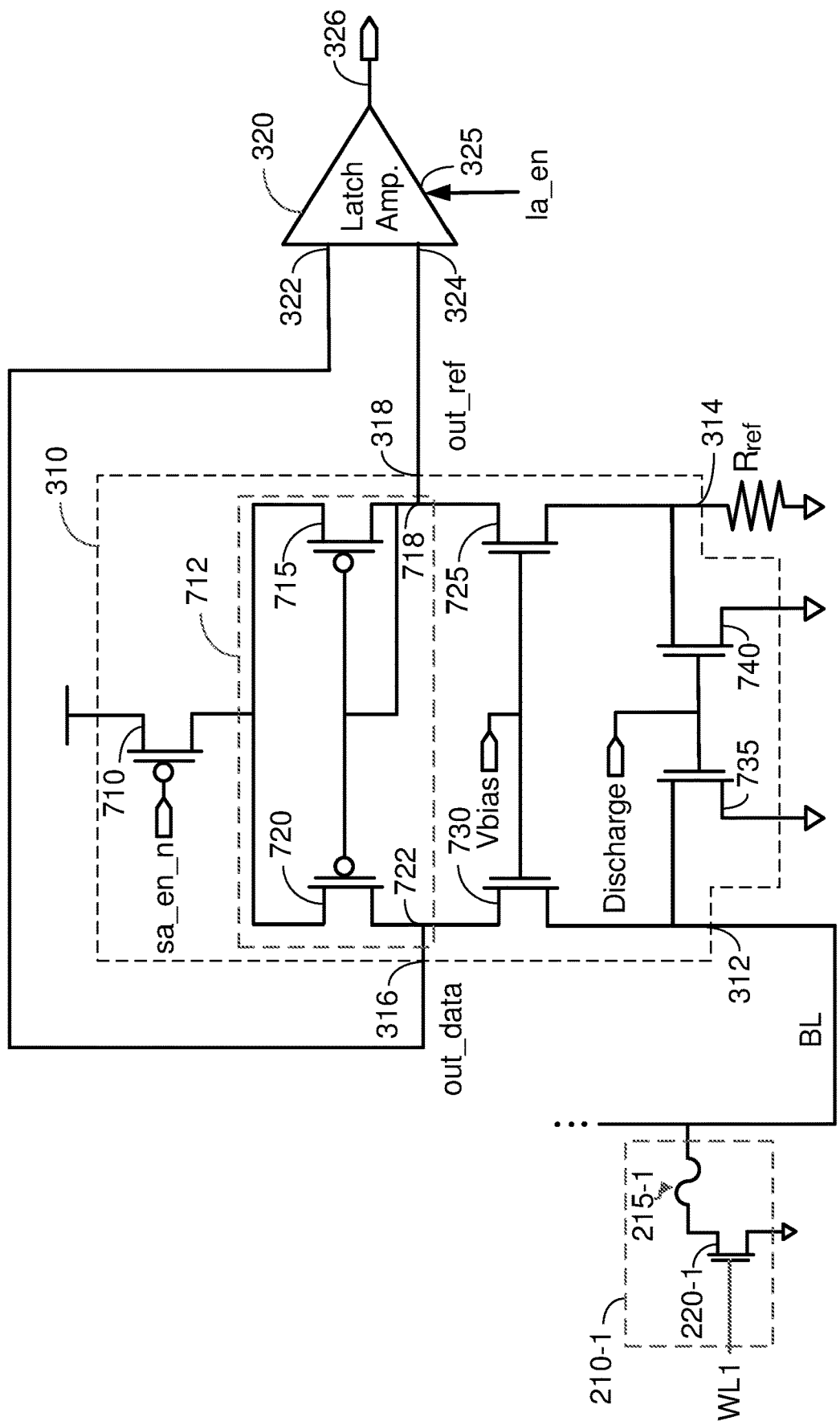
FIG. 7 shows an exemplary implementation of a sense amplifier according to certain aspects of the present disclosure.

FIG. 7 shows an exemplary implementation of the first sense amplifier 310 according to certain aspects of the present disclosure. In this example, the first sense amplifier 310 includes an enable transistor 710, a current mirror 712, a first common-gate transistor 725, a second common-gate transistor 730, a first discharge transistor 735, and a second discharge transistor 740. The enable transistor 710 (e.g., PFET) is coupled between the supply rail and the current mirror 712. As discussed further below, the enable transistor 710 is configured to couple the current mirror 712 to the supply rail when the first sense amplifier 310 is enabled, and decouple the current mirror 712 from the supply rail when the first sense amplifier 310 is disabled.

The current mirror 712 has a first current branch 718 and a second current branch 722, and is configured to mirror (i.e., copy) the current in the first current branch 718 to the second current branch 722. In the example in FIG. 7, the current mirror 712 includes a first current-mirror transistor 715 (e.g., PFET) and a second current-mirror transistor 720 (e.g., PFET). The source of the first current-mirror transistor 715 is coupled to the drain of the enable transistor 710, the drain of the first current-mirror transistor 715 is coupled to the first current branch 718, and the gate of the first current-mirror transistor 715 is coupled to the drain of the first current-mirror transistor 715. The source of the second current-mirror transistor 720 is coupled to the drain of the enable transistor 710, the drain of the second current-mirror transistor 720 is coupled to the second current branch 722, and the gate of the second current-mirror transistor 720 is coupled to the gate of the first current-mirror transistor 715.

The drain of the first common-gate transistor 725 (e.g., NFET) is coupled to the first current branch 718 of the current mirror 712, the gate of the first common-gate transistor 725 is biased by a bias voltage (labeled "Vbias"), and the source of the first common-gate transistor 725 is coupled to the second input 314 of the first sense amplifier 310. The drain of the second common-gate transistor 730 (e.g., NFET) is coupled to the second current branch 722 of the current mirror 712, the gate of the second common-gate transistor 730 is biased by the bias voltage Vbias, and the source of the second common-gate transistor 730 is coupled to the first input 312 of the first sense amplifier 310. The first output 316 of the first sense amplifier 310 is coupled between the current mirror 712 and the drain of the second common-gate transistor 730, and the second output 318 of the first sense amplifier 310 is coupled between the current mirror 712 and the drain of the first common-gate transistor 725, as shown in FIG. 7.

The drain of the first discharge transistor 735 (e.g., NFET) is coupled to the first input 312 of the first sense amplifier 310, and the source of the first discharge transistor 735 is coupled to ground. The drain of the second discharge transistor 740 (e.g., NFET) is coupled to the second input 314 of the first sense amplifier 310, and the source of the second discharge transistor 740 is coupled to ground. The gates of the discharge transistors 735 and 740 are driven by a discharge control signal.

Before a read operation, the enable transistor 710 is turned off, decoupling the current mirror 712 from the supply rail. Also, the first and second discharge transistors 735 and 740 are turned on (e.g., by setting the discharge control signal high). As a result, the first discharge transistor 735 discharges the capacitive load on the bit line BL (which is coupled to the first input 312), and the second discharge transistor 740 couples the second input 314 to ground.

When the first sense amplifier 310 is enabled by the sense enable signal sa_en for a read operation, the enable transistor 710 is turned on, and the first and second discharge transistors 735 and 740 are turned off (e.g., by setting the discharge control signal low). In the example in FIG. 7, the enable transistor 710 is implemented with a PFET, in which the gate of the enable transistor 710 is driven by the inverse of the sense enable signal sa_en (labeled "sa_en_n"). In this example, the inverse sense enable signal sa_en_n is low when the first sense amplifier 310 is enabled, which turns on the enable transistor 710.

When the current mirror 712 is coupled to the supply rail by the enable transistor 710, current flows through the first current branch 718 of the current mirror 712. The current depends on the resistance of the reference resistor $R_{ref}$ and the bias voltage Vbias of the first common-gate transistor 725. The current mirror 712 mirrors (i.e., copies) the current in the first current branch 718 to the second current branch 722. The mirrored current in the second current branch 722 flows into the bit line BL, providing the pre-charging current for pre-charging the bit line BL.

If the fuse of the selected bit cell (i.e., selected one of the bit cells 210-1 to 210-n) is unblown, then the pre-charging current flows to ground through the unblown fuse and the transistor of the selected bit cell. In this case, the voltage at the first input 312 remains low, resulting in a data voltage out_data at the first output 316 that is below the reference voltage out_ref at the second output 318.

If the fuse of the selected bit cell is blown, then the pre-charging current charges the capacitive load on the bit line BL, causing the voltage at the first input 312 to rise. The rise in the voltage at the first input 312 causes the data voltage out_data at the first output 316 to rise. Eventually, the data voltage out_data reaches a steady state voltage above the reference voltage out_ref. In the example in FIG. 7, the second common-gate transistor 730 acts as a common-gate amplifier. The second current branch 722 of the current mirror 712 acts as a current-source load for the common-gate amplifier, in which the current of the current-source load is set by the current in the first current branch 718 of the current mirror 712.

Figure 8:
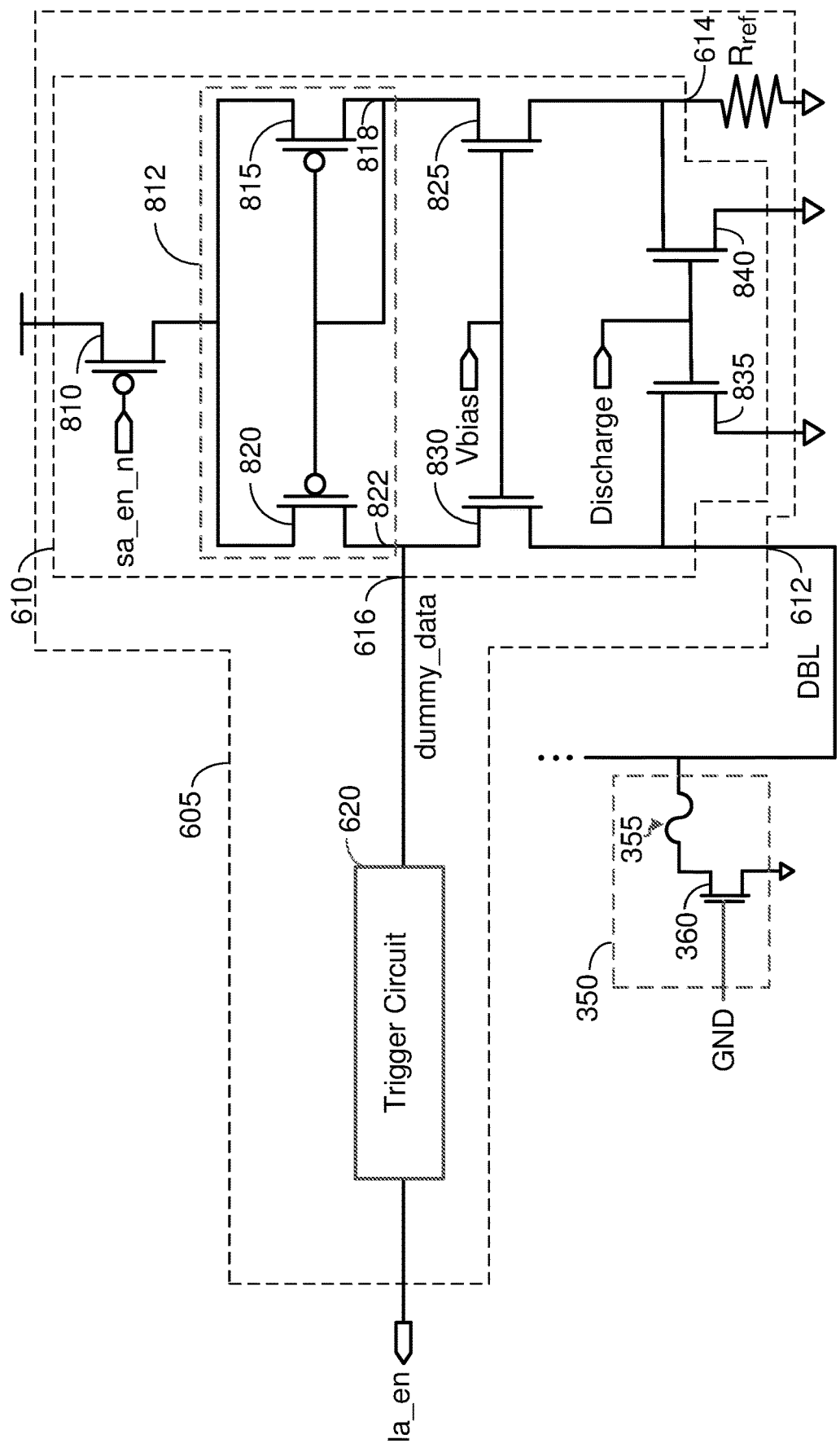
FIG. 8 shows an exemplary implementation of a sense amplifier in a read tracker according to certain aspects of the present disclosure.

FIG. 8 shows an exemplary implementation of the second sense amplifier 610 according to certain aspects of the present disclosure. In this example, the second sense amplifier 610 includes an enable transistor 810, a current mirror 812, a first common-gate transistor 825, a second common-gate transistor 830, a first discharge transistor 835, and a second discharge transistor 840. The enable transistor 810 (e.g., PFET) is coupled between the supply rail and the current mirror 812. The enable transistor 810 is configured to couple the current mirror 812 to the supply rail when the second sense amplifier 610 is enabled, and decouple the current mirror 812 from the supply rail when the second sense amplifier 610 is disabled.

The current mirror 812 has a first current branch 818 and a second current branch 822, and is configured to mirror (i.e., copy) the current in the first current branch 818 to the second current branch 822. In the example in FIG. 8, the current mirror 812 includes a first current-mirror transistor 815 (e.g., PFET) and a second current-mirror transistor 820 (e.g., PFET). The source of the first current-mirror transistor 815 is coupled to the drain of the enable transistor 810, the drain of the first current-mirror transistor 815 is coupled to the first current branch 818, and the gate of the first current-mirror transistor 815 is coupled to the drain of the first current-mirror transistor 815. The source of the second current-mirror transistor 820 is coupled to the drain of the enable transistor 810, the drain of the second current-mirror transistor 820 is coupled to the second current branch 822, and the gate of the second current-mirror transistor 820 is coupled to the gate of the first current-mirror transistor 815.

The drain of the first common-gate transistor 825 (e.g., NFET) is coupled to the first current branch 818 of the current mirror 812, the gate of the first common-gate transistor 825 is biased by the bias voltage Vbias, and the source of the first common-gate transistor 825 is coupled to the second input 614 of the second sense amplifier 610. The drain of the second common-gate transistor 830 (e.g., NFET) is coupled to the second current branch 822 of the current mirror 812, the gate of the second common-gate transistor 830 is biased by the bias voltage Vbias, and the source of the second common-gate transistor 830 is coupled to the first input 612 of the second sense amplifier 610. The output 616 of the second sense amplifier 610 is coupled between the current mirror 812 and the drain of the second common-gate transistor 830, as shown in FIG. 8.

The drain of the first discharge transistor 835 (e.g., NFET) is coupled to the first input 612 of the second sense amplifier 610, and the source of the first discharge transistor 835 is coupled to ground. The drain of the second discharge transistor 840 (e.g., NFET) is coupled to the second input 614 of the second sense amplifier 610, and the source of the second discharge transistor 840 is coupled to ground. The gates of the discharge transistors 835 and 840 are driven by the discharge control signal.

Before a read operation, the enable transistor 810 is turned off, decoupling the current mirror 812 from the supply rail. Also, the first and second discharge transistors 835 and 840 are turned on (e.g., by setting the discharge control signal high). As a result, the first discharge transistor 835 discharges the capacitive load on the dummy bit line DBL (which is coupled to the first input 612), and the second discharge transistor 840 couples the second input 614 to ground.

When the second sense amplifier 610 is enabled by the sense enable signal sa_en, the enable transistor 810 is turned on, and the first and second discharge transistors 835 and 840 are turned off (e.g., by setting the discharge control signal low). The enable transistor 810 couples the current mirror 812 to the supply rail. When the current mirror 812 is coupled to the supply rail by the enable transistor 810, current flows through the first current branch 818 of the current mirror 812. The current depends on the resistance of the reference resistor $R_{ref}$ and the bias voltage Vbias of the first common-gate transistor 825. The current mirror 812 mirrors (i.e., copies) the current in the first current branch 818 to the second current branch 822. The mirrored current in the second current branch 822 flows into the dummy bit line DBL, providing charging current for charging the dummy bit line DBL.

The charging current charges the capacitive load on the dummy bit line DBL, causing the voltage at the first input 612 to rise. The rise in the voltage at the first input 612 causes the dummy output voltage dummy_data at the output 616 to rise. Eventually, the dummy output voltage dummy_data reaches the threshold voltage of the trigger circuit 620, triggering the trigger circuit 620 to output the latch enable signal la_en, as discussed above. In the example in FIG. 8, the second common-gate transistor 830 acts as a common-gate amplifier. The second current branch 822 of the current mirror 812 acts as a current-source load for the common-gate amplifier, in which the current of the current-source load is set by the current in the first current branch 818 of the current mirror 812.

The dimensions of transistors 815, 820, 825 and 830 in the second sense amplifier 610 may be the same as or different from the dimensions of transistors 715, 720, 725 and 730, respectively, in the first sense amplifier 310. The reference resistor coupled to the second input 314 of the first sense amplifier 310 may have the same resistance as the reference resistor coupled to the second input 614 of the second sense amplifier 610 or a different resistance. In certain aspects, the resistance of the reference resistor coupled to the second sense amplifier 610 is slightly higher than the resistance of the reference resistor coupled to the first sense amplifier 310 to provide an additional time margin for the latch enable signal la_en.

Figure 9:
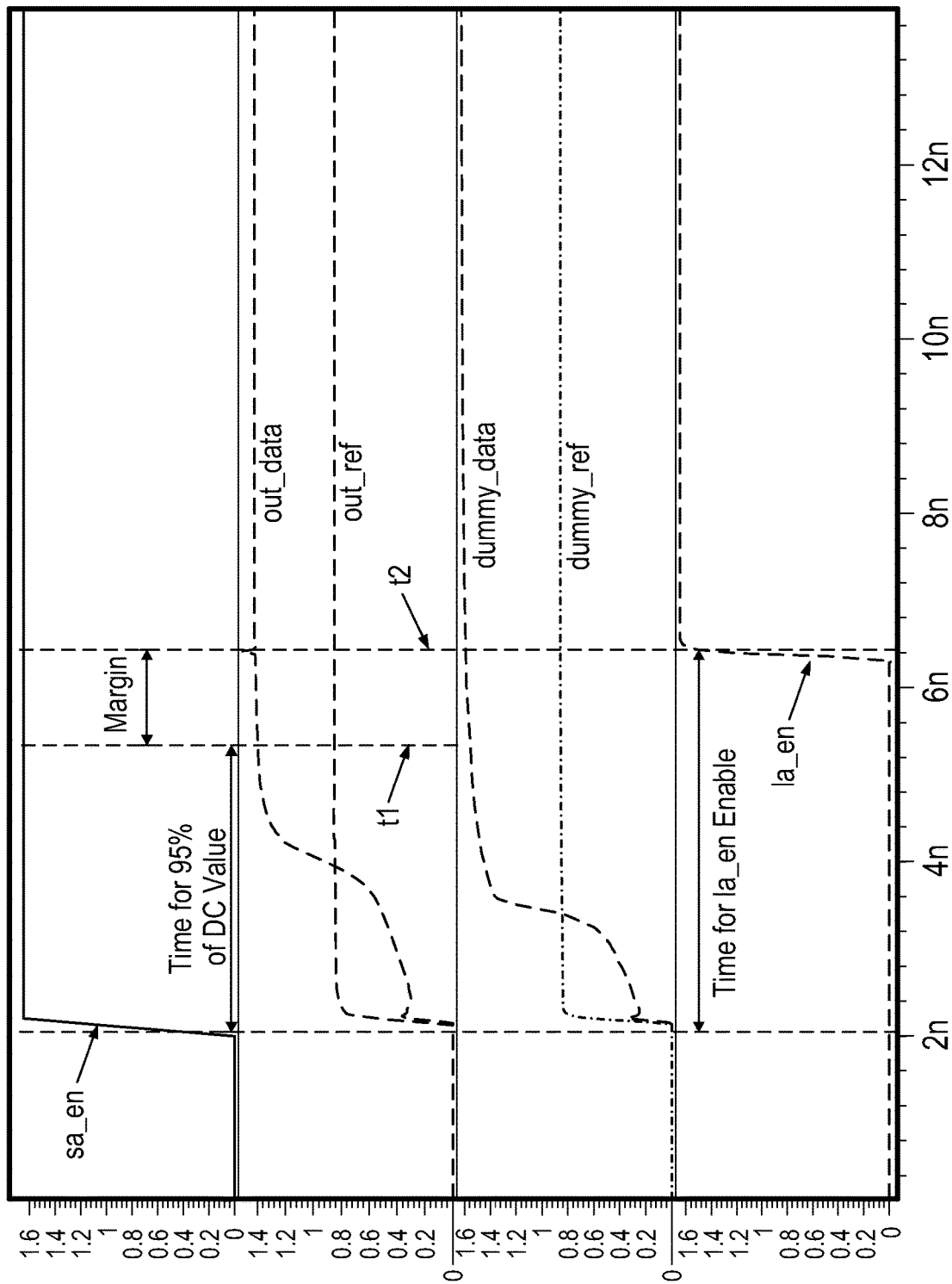
FIG. 9 is a timing diagram showing exemplary signals for a read circuit and a read tracker including a sense amplifier according to certain aspects of the present disclosure.

FIG. 9 shows an exemplary timing diagram of the sense enable signal sa_en, the data voltage out_data, the reference voltage out_ref, the dummy output voltage dummy_data, and the latch enable signal la_en. In this example, the fuse of the bit cell being read is blown. Both the sense enable signal sa_en and the latch enable signal la_en have a logic value of one. In this example, the first sense amplifier 310 is implemented with the exemplary implementation shown in FIG. 7, and the second sense amplifier 610 is implemented with the exemplary implementation shown in FIG. 8. FIG. 9 also shows a dummy reference voltage (labeled "dummy_ref"), which is the voltage between the current mirror 812 and the drain of the first common-gate transistor 825 in the second sense amplifier 610.

In this example, the data voltage out_data reaches a voltage close to the steady state voltage at time t1. At this point, the data voltage out_data is above the reference voltage out_ref, and the latch amplifier 320 is capable of making a reliable read. The latch enable signal la_en is output at time t2, at which point the latch amplifier 320 is enabled. In this example, the timing margin between time t1 and time t2 is approximately one ns. In comparison, in the timing diagram for the read tracker 340 in FIG. 5, the timing margin is much larger at 13 ns. This is because the read tracking time for the read tracker 340 is set based on the worst-case PVT scenario, which results in large timing margins for non-worst-case PVT scenarios. In contrast, the read tracker 605 automatically adjusts (i.e., modulates) the read tracking time according to PVT variations, enabling the read tracker 605 to reduce the read tracking time for non-worst-case PVT scenarios. The reduced tracking time reduces read access time and power consumption.

Figure 10:
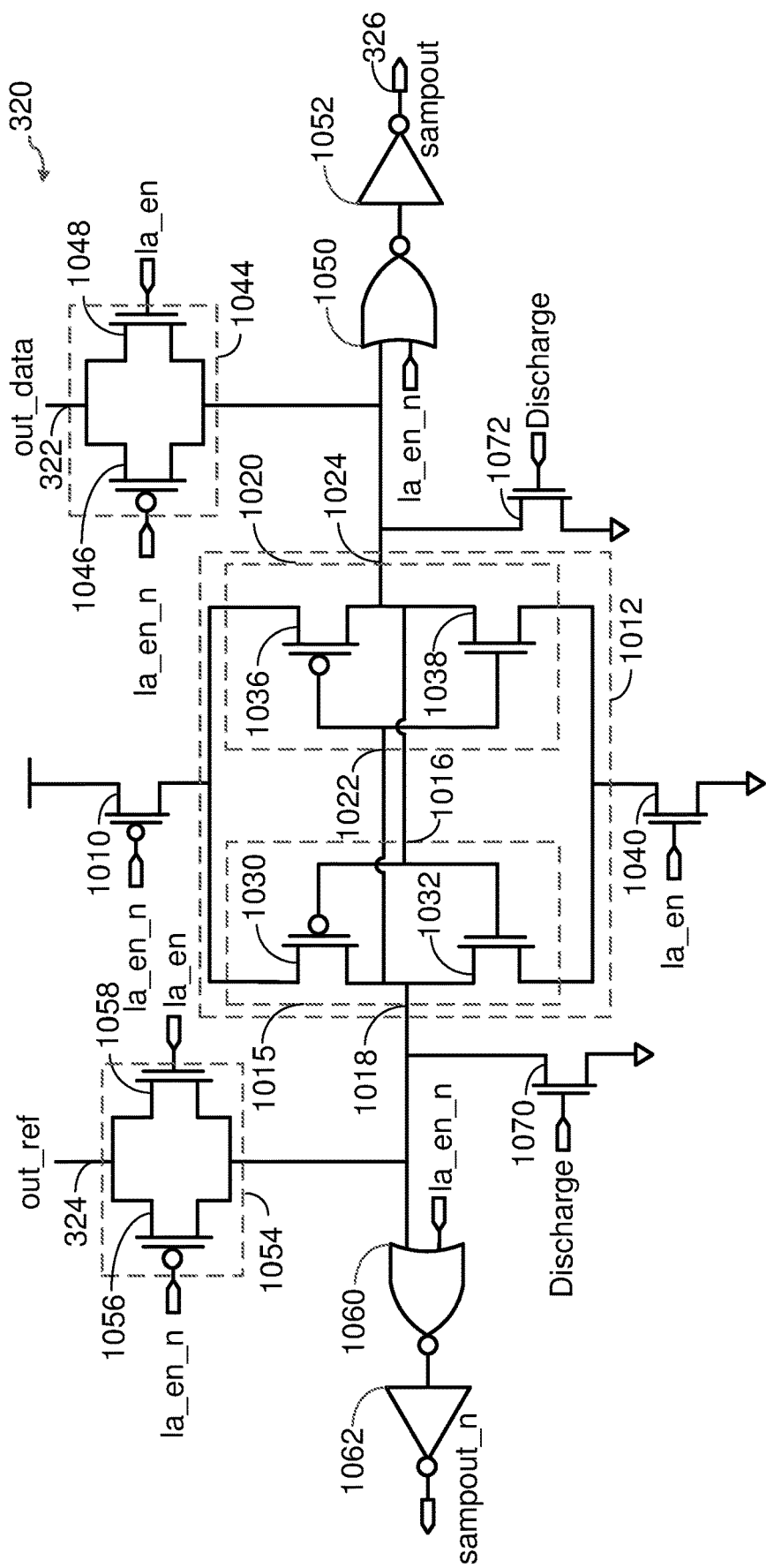
FIG. 10 shows an exemplary implementation of a latch amplifier according to certain aspects of the present disclosure.

FIG. 10 shows an exemplary implementation of the latch amplifier 320 according to certain aspects of the present disclosure. In this example, the latch amplifier 320 includes a first transmission gate 1044, a second transmission gate 1054, a latch 1012, a first enable transistor 1010 (e.g., PFET), a second enable transistor 1040 (e.g., NFET), a first discharge transistor 1070 (e.g., NFET), a second discharge transistor 1072 (e.g., NFET), a first NOR gate 1050, a second NOR gate 1060, a first output inverter 1052, and a second output inverter 1062.

The latch 1012 includes a first latch inverter 1015 and a second latch inverter 1020. The first latch inverter 1015 and the second latch inverter 1020 are coupled back-to-back, in which the output 1018 of the first latch inverter 1015 is coupled to the input 1022 of the second latch inverter 1020 and the output 1024 of the second latch inverter 1020 is coupled to the input 1016 of the first latch inverter 1015. In this example, the first latch inverter 1015 is a complementary inverter including a PFET 1030 and an NFET 1032, and the second latch inverter 1020 is a complementary inverter including a PFET 1036 and an NFET 1038. The first enable transistor 1010 is coupled between the supply rail and the latch 1012, and the second enable transistor 1040 is coupled between the latch 1012 and ground.

The first discharge transistor 1070 is coupled between the output 1018 of the first latch inverter 1015 and ground, and the second discharge transistor 1072 is coupled between the output 1024 of the second latch inverter 1020 and ground. The first NOR gate 1050 has a first input coupled to the output 1024 of the second latch inverter 1020, a second input configured to receive the inverse latch enable signal la_en_n, and an output coupled to the input of the first output inverter 1052. The output of the first output inverter 1052 is coupled to the output 326 of the latch amplifier 320. The second NOR gate 1060 has a first input coupled to the output 1018 of the first latch inverter 1015, a second input configured to receive the inverse latch enable signal la_en_n, and an output coupled to the input of the second output inverter 1062.

The first transmission gate 1044 is coupled between the first input 322 of the latch amplifier 320 and the input 1016 of the first latch inverter 1015, and the second transmission gate 1054 is coupled between the second input 324 of the latch amplifier 320 and the input 1022 of the second latch inverter 1020. The first transmission gate 1044 includes a PFET 1046 and an NFET 1048 coupled in parallel, and the second transmission gate 1054 includes a PFET 1056 and an NFET 1058 coupled in parallel.

Exemplary operations of the latch amplifier 320 during a read operation will now be described according to certain aspects of the present disclosure. Before the latch amplifier 320 is enabled, the first and second enable transistors 1010 and 1040 are turned off, and the first and second transmission gates 1044 and 1054 are open. As a result, the latch 1012 is decoupled from the supply rail and the inputs 322 and 324 of the latch amplifier 320. Also, the first and second discharge transistors 1070 and 1072 are turned on. As a result, the first and second discharge transistors 1070 and 1072 discharge the outputs 1018 and 1024 of the first and second latch inverters 1015 and 1020 to approximately ground.

When the latch amplifier 320 is enabled by the enable signal la_en, the first and second enable transistors 1010 and 1040 are turned on, and the first and second transmission gates 1044 and 1054 are closed. As a result, the latch 1012 is coupled to the supply rail and the inputs 322 and 324 of the latch amplifier 320. Also, the first and second discharge transistors 1070 and 1072 are turned off.

If the data voltage out_data is greater than the reference voltage out_ref, then the latch 1012 latches a first logic state in which the output 1024 of the second latch inverter 1020 is high and the output 1018 of the first latch inverter 1015 is low. In this case, the latch amplifier 320 outputs a logic one at the output 326 (labeled "sampout"). The output of the second output inverter 1062 outputs the inverse of the output 326 (labeled "sampout_n"), which is zero in this case. If the data voltage out_data is less than the reference voltage out_ref, then the latch 1012 latches a second logic state in which the output 1024 of the second latch inverter 1020 is low and the output 1018 of the first latch inverter 1015 is high. In this case, the latch amplifier 320 outputs a logic zero at the output 326 (labeled "sampout").

Figure 11:
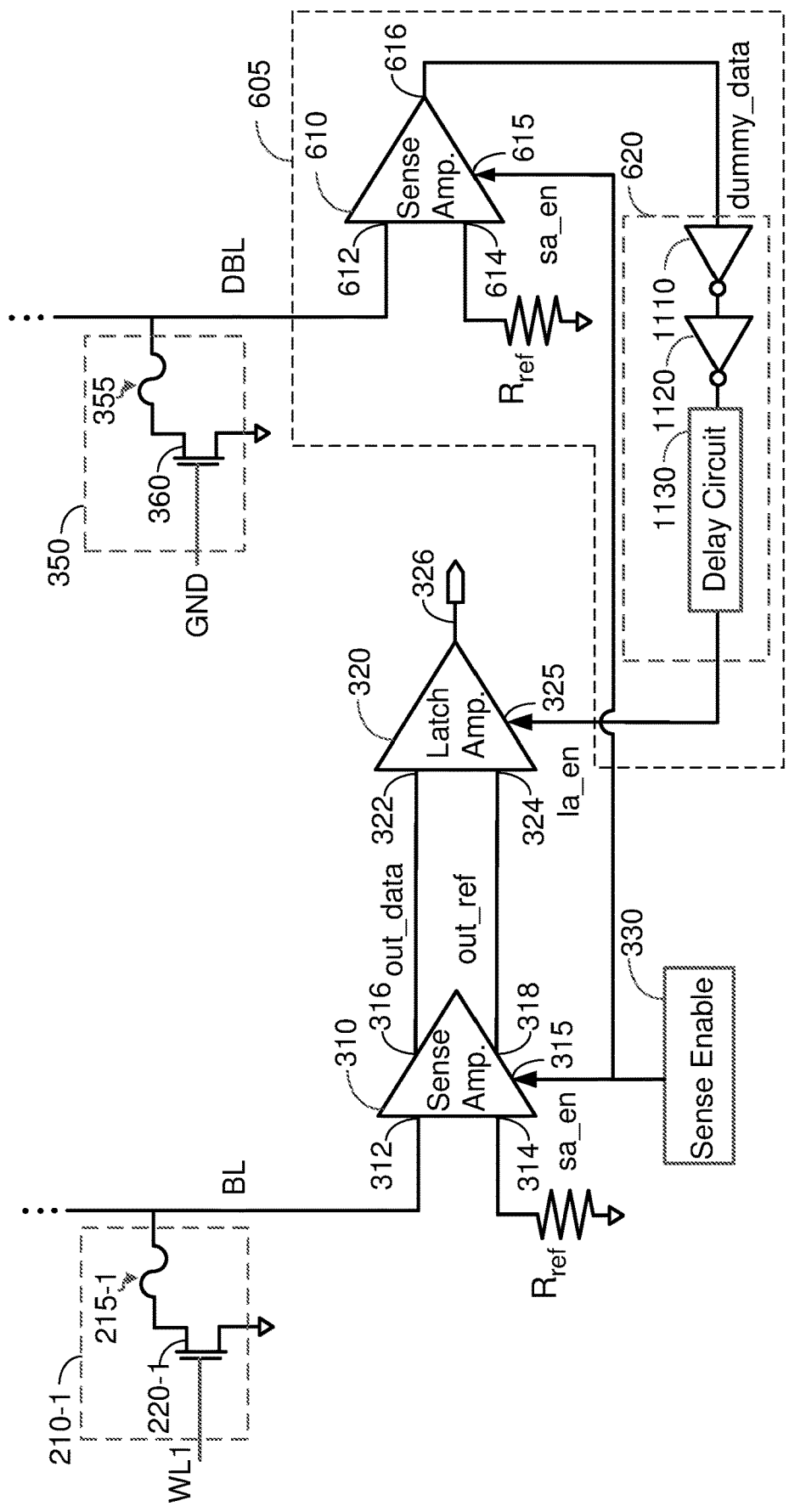
FIG. 11 shows an exemplary implementation of a trigger circuit according to certain aspects of the present disclosure.

FIG. 11 shows an exemplary implementation of the trigger circuit 620 according to certain aspects. In this example, the trigger circuit 620 includes a first inverter 1110, a second inverter 1120, and a delay circuit 1130. The first and second inverters 1110 and 1120 are coupled in series, in which the input of the first inverter 1110 is coupled to the output 616 of the second sense amplifier 610. The delay circuit 1130 is coupled between the output of the second inverter 1120 and the enable input 325 of the latch amplifier 320. In this example, the trigger circuit 620 is triggered when the dummy output voltage dummy_data reaches the switching threshold voltage of the first inverter 1110. Thus, in this example, the threshold voltage of the trigger circuit 620 corresponds to the switching threshold voltage of the first inverter 1110. The switching threshold voltage of the first inverter 1110 may be defined as the input voltage at which the output of the first inverter 1110 changes (i.e., flips) logic states.

When the dummy output voltage dummy_data reaches the switching threshold voltage of the first inverter 1110, the first and second inverters 1110 and 1120 flip logic states, causing the output of the second inverter 1120 to change from logic zero to logic one (which is the logic value of the latch enable signal la_en in this example). The delay circuit 1130 delays the logic one from the second inverter 1120 by a short time delay and outputs the logic one as the latch enable signal la_en after the short time delay. In this example, the time delay of the trigger circuit 620 is the combined time delays of the inverters 1110 and 1120 and the delay circuit 1130. In certain aspects, the time delay of the delay circuit 1130 may be programmable.

Although aspects of the present disclosure are discussed above using the example of PROM, it is to be appreciated that the present disclosure is not limited to this example. The read circuit 120 and the controller 125 according to aspects of the present disclosure may be used to read other types of memories including, but not limited to, spin-transfer-torque magnetic random access memory (STT-MRAM), resistive RAM (ReRAM), phase-change memory (PCRAM), etc.

It is to be appreciated that the first sense amplifier 310 is not limited to the exemplary implementation shown in FIG. 7, the second sense amplifier 610 is not limited to the exemplary implementation shown in FIG. 8, and the latch amplifier 320 is not limited to the exemplary implementation shown in FIG. 10. For example, in some implementations, the second input 314 and the second output 318 of the first sense amplifier 310 may be omitted, and the second input 614 of the second sense amplifier 610 may be omitted. In these implementations, the reference voltage out_ref at the second input 324 of the latch amplifier 320 may be provided by a voltage divider or another type of circuit. The sense amplifiers 310 and 610 may be implemented with current sense amplifiers, current-mode latch-sense amplifiers (CL-SAs), charge transfer sense amplifiers (CTSAs), or any other type of sense amplifiers configured to read memory bits.

Also, it is to be appreciated that the trigger circuit 620 is not limited to the exemplary implementation shown in FIG. 11. For example, the first and second inverters 1110 and 1120 may be replaced with a voltage comparator that compares the dummy output voltage dummy_data with a threshold voltage, and triggers the trigger circuit 620 when the dummy output voltage dummy_data is greater than the threshold voltage.

Figure 12:
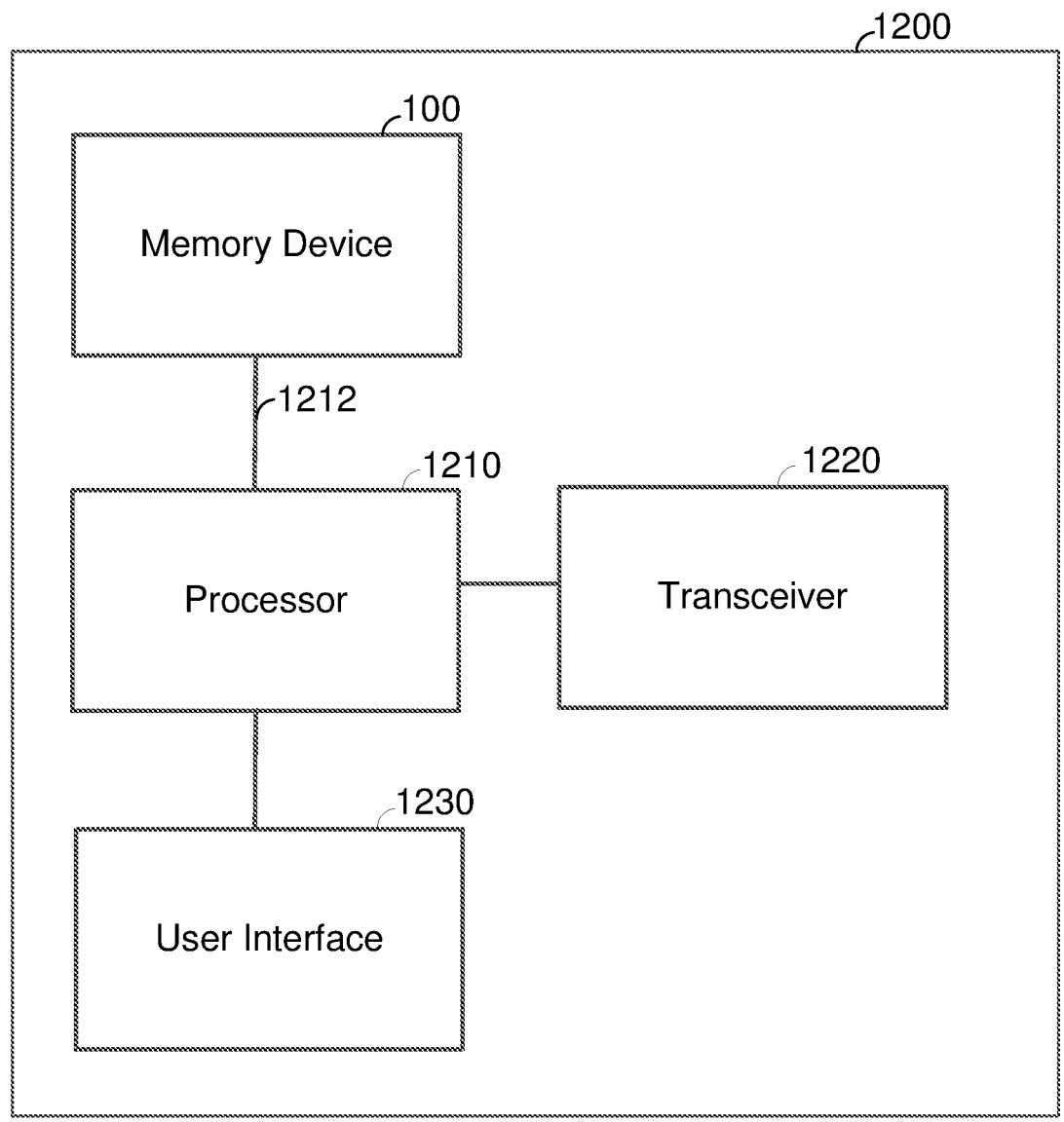
FIG. 12 shows an exemplary system according to certain aspects of the present disclosure.

FIG. 12 shows an example of a system 1200 including the memory device 100 according to certain aspects of the present disclosure. The system 1200 may be part of a mobile wireless device (e.g., a handset), a small base station (e.g., customer premises equipment (CPE)), or another wireless device.

The system 1200 includes a processor 1210 coupled to the memory device 100. The processor 1210 may include a central computing unit (CPU) or another type of processor. The processor 1210 may be coupled to the memory device 100 via a link 1212, which may include a SerDes link, a PCIe link, and/or another type of link. The system 1200 may also include one or more other memory devices (not shown) coupled to the processor 1210.

In certain aspects, the processor 1210 accesses information (e.g., security keys, system settings, etc.) stored on the memory device 100 by sending a read command to the memory device 100. The read command may include an address or range of addresses from which the information is to be read. The controller 125 (shown in FIG. 1) may receive the read command via the memory interface circuit 130 (shown in FIG. 1), which is coupled to the link 1212. In response to the read command, the controller 125 in the memory device 100 may direct the read circuit 120 (shown in FIG. 1) to read data from bit cells (e.g., bit cells 210-1 to 210-n) in the memory array 110 corresponding to the address or range of addresses accompanying the read command. The memory interface circuit 130 may then send the read data to the processor 1210 via the link 1212. In one example, the memory interface circuit 130 interfaces the output of the latch amplifier 320 (shown in FIG. 3) in the memory device 100 to the processor 1210. In this example, the memory interface circuit 130 may send one or more read data bits at the output of the latch amplifier 320 to the processor 1210 via the link 1212.

The system 1200 may also include a transceiver 1220 coupled to the processor 1210. The transceiver 1220 is configured to provide wireless communication between the processor 1210 and another wireless device (not shown), and may support one or more radio technologies for wireless communication such as 5G, LTE, CDMA2000, WCDMA, TD-SCDMA, GSM, IEEE 802.11, etc. The transceiver 1220 may be configured to receive data from the processor 1210, and process the data for wireless transmission via one or more antennas (not shown). The transceiver 1220 may also be configured to receive one or more radio signals via one or more antennas, recover data from the one or more radio signals, and send the recovered data to the processor 1210. The transceiver 1220 may include a baseband processor (also referred to as a modem), a radio frequency (RF) front-end circuit, etc.

For the case in which the system 1200 is part of a mobile wireless device, the system 1200 may include a user interface 1230 coupled to the processor 1210. The user interface 1230 may be configured to receive data from a user (e.g., via keypad, mouse, joystick, etc.) and provide the data to the processor 1210. The user interface 1230 may also be configured to output data from the processor 1210 to the user (e.g., via a display, speaker, etc.).

Figure 13:
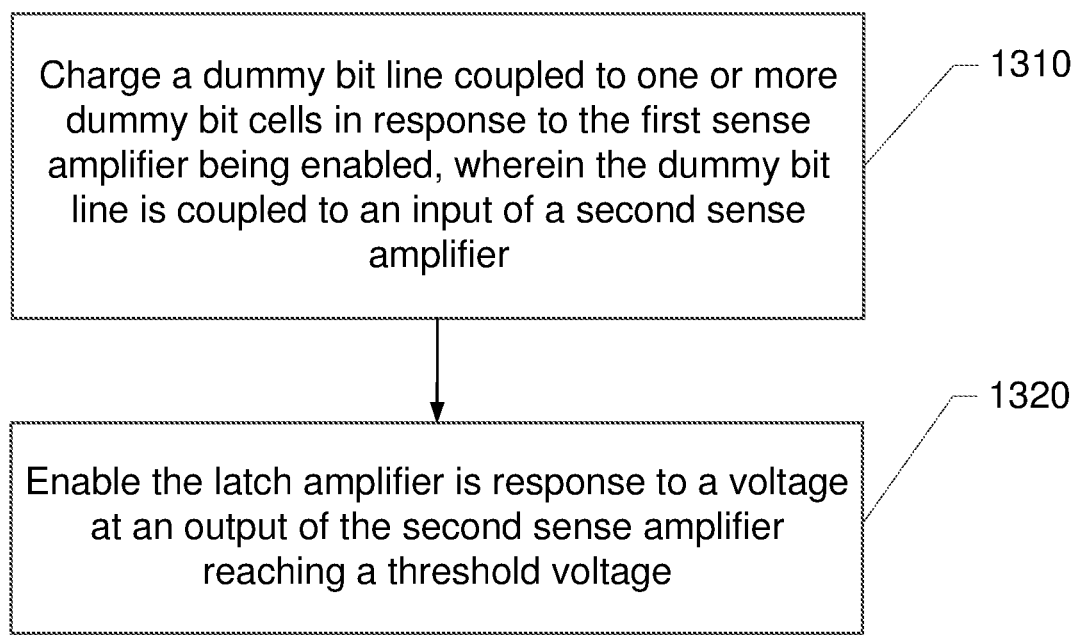
FIG. 13 is a flowchart illustrating an exemplary method for reading a memory bit cell according to certain aspects of the present disclosure.

FIG. 13 is a flowchart illustrating an example of a method 1300 for reading a memory bit cell, wherein the memory bit cell is coupled to an input of a first sense amplifier via a read bit line, and an output of the first sense amplifier is coupled to an input of a latch amplifier. The first sense amplifier may correspond to the first sense amplifier 310 and the latch amplifier may correspond to the latch amplifier 320.

At block 1310, a dummy bit line coupled to one or more dummy bit cells is charged in response to the first sense amplifier being enabled, wherein the dummy bit line is coupled to an input of a second sense amplifier. For example, the one or more dummy bit cells may correspond to the one or more dummy bit cells 350, and the second sense amplifier may correspond to the second sense amplifier 610. In one example, the second sense amplifier may charge the dummy bit line when the second sense amplifier is enabled. In this example, the second sense amplifier may be enabled at approximately the same time as the first sense amplifier (e.g., by the same sense enable signal (e.g., sa_en)).

At block 1320, the latch amplifier is enabled in response to a voltage at an output of the second sense amplifier reaching a threshold voltage. The latch amplifier may be enabled immediately after the voltage at the output of the second sense amplifier reaches the threshold voltage or after a time delay from the time that the voltage at the output of the second sense amplifier reaches the threshold voltage. The time delay may include the delay of a delay circuit (e.g., the delay circuit 1130) and/or the delay of one or more inverters (e.g., the first and second inverters 1110 and 1120). In one example, the threshold voltage may correspond to the switching threshold voltage of an inverter (e.g., the first inverter 1110).

The program circuit 115, the read circuit 120, and the controller 125 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A memory device, comprising:
    memory bit cells coupled to a read bit line;
    a first sense amplifier having a first input coupled to the read bit line, a first output, a second input, and a second output, wherein the first sense amplifier is configured to
        pre-charge the read bit line when the first sense amplifier is enabled by a sense enable signal, and
        output a data voltage at the first output of the first sense amplifier based on a voltage of the read bit line;
    a latch amplifier having a first input coupled to the first output of the first sense amplifier, a second input coupled to the second output of the first sense amplifier, an enable input, and an output;
    one or more dummy bit cells coupled to a dummy bit line;
    a second sense amplifier having a first input coupled to the dummy bit line, and an output;
    a trigger circuit having an input coupled to the output of the second sense amplifier, and an output coupled to the enable input of the latch amplifier;
    a sense enable circuit coupled to an enable input of the first sense amplifier, wherein the sense enable circuit is configured to output the sense enable signal to the enable input of the first sense amplifier when one of the memory bit cells is selected during a read operation; and
    a reference resistor coupled between the second input of the first sense amplifier and a ground, wherein the first sense amplifier is configured to output a reference voltage at the second output based on the reference resistor.

2. The memory device of claim 1, wherein each of the memory cells comprises:
    a respective transistor; and
    a respective fuse coupled between the respective transistor and the read bit line.

3. The memory device of claim 2, wherein each of the one or more dummy bit cells comprises:
    a respective transistor; and
    a respective fuse coupled between the respective transistor and the dummy bit line.

4. The memory device of claim 3, wherein, for each of the one or more dummy bit cells, a gate of the respective transistor is coupled to a ground.

5. The memory device of claim 2, wherein, for each of the memory bit cells, a gate of the respective transistor is coupled to a respective one of a plurality of word lines.

6. The memory device of claim 1, wherein the trigger circuit is configured to output an enable signal to the enable input of the latch amplifier in response to a voltage at the input of the trigger circuit reaching a threshold voltage.

7. The memory device of claim 6, wherein the trigger circuit comprises an inverter, and the threshold voltage corresponds to a switching threshold voltage of the inverter.

8. The memory device of claim 1, wherein the latch amplifier is configured to latch a first logic state or a second logic state based on the data voltage.

9. The memory device of claim 1, wherein the sense enable circuit is coupled to an enable input of the second sense amplifier, and the sense enable circuit is configured to output the sense enable signal to the enable input of the second sense amplifier.

10. The memory device 9, wherein the second sense amplifier is configured to:
   charge the dummy bit line when the second sense amplifier is enabled by the sense enable signal; and
   output a dummy output voltage based on a voltage of the dummy bit line.

11. The memory device of claim 10, wherein the trigger circuit is configured to output a latch enable signal to the enable input of the latch amplifier in response to the dummy output voltage reaching a threshold voltage.

12. The memory device of claim 10, wherein the first sense amplifier is configured to:
   pre-charge the read bit line when the first sense amplifier is enabled by the sense enable signal; and
   output a data voltage at the first output of the first sense amplifier based on a voltage of the read bit line.

13. The memory device of claim 1, wherein the latch amplifier is configured to latch a first logic state or a second logic state based on the data voltage and the reference voltage.

14. The memory device of claim 13, wherein the latch amplifier is configured to:
   latch the first logic state if the data voltage is greater than the reference voltage; and
   latch the second logic state if the data voltage is less than the reference voltage.

15. A system, comprising:
   a processor; and
   the memory device of claim 1.

* * * * *